(12) United States Patent
Robert

(10) Patent No.: US 7,635,901 B2
(45) Date of Patent: Dec. 22, 2009

(54) MICROCOMPONENT COMPRISING A HERMETICALLY-SEALED CAVITY AND A PLUG, AND METHOD OF PRODUCING ONE SUCH MICROCOMPONENT

(75) Inventor: Philippe Robert, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 200 days.

(21) Appl. No.: 10/582,521

(22) PCT Filed: Dec. 13, 2004

(86) PCT No.: PCT/FR2004/003217

§ 371 (c)(1),
(2), (4) Date: Jun. 9, 2006

(87) PCT Pub. No.: WO2005/061375

PCT Pub. Date: Jul. 7, 2005

(65) Prior Publication Data

US 2007/0126068 A1    Jun. 7, 2007

(30) Foreign Application Priority Data

Dec. 19, 2003    (FR)    ................... 03 15031

(51) Int. Cl.
*G01R 33/09*    (2006.01)
*G01L 1/12*    (2006.01)
(52) U.S. Cl. ............... 257/415; 257/E23.181; 257/414; 257/419; 257/420; 438/48; 438/125; 333/186

(58) Field of Classification Search .......... 257/E29.324, 257/678, 414, 415, 417, 418–420, 619, E23.181; 438/48, 50, 52, 125, 126; 333/186, 197, 333/200

See application file for complete search history.

(56) References Cited

U.S. PATENT DOCUMENTS 5,477,008 A    12/1995    Pasqualoni et al.

(Continued)

FOREIGN PATENT DOCUMENTS

DE    100 05 555 A    8/2001

(Continued)

OTHER PUBLICATIONS

Gogoi et al., "Force Balanced Micromachined Pressure Sensors," IEEE Transactions on Electron Devices, vol. 48, No. 8, IEEE, N.Y., Aug. 2001, pp. 1575-1584.

*Primary Examiner*—Chris C Chu
(74) *Attorney, Agent, or Firm*—Oliff & Berridge, PLC

(57) ABSTRACT

The microcavity is delineated by a cover which is formed on a sacrificial layer and in which at least one hole is formed for removal of the sacrificial layer. A plug covers the hole and part of the cover along the periphery of the hole. The plug is made from a material that can undergo creep deformation and can be a polymerized material, in particular selected from photoresists and polyimide, or glass, in particular selected from phosphosilicate glasses. A sealing layer is deposited on the plug and the cover such as to seal the microcavity hermetically. The hole has, for example, a dimension of less than 5 micrometers and is preferably arranged on the highest part of the microcavity. The plug can have a thickness of between 2 and 6 micrometers.

18 Claims, 4 Drawing Sheets

U.S. PATENT DOCUMENTS

| | | | |
|---|---|---|---|
| 5,589,082 A * | 12/1996 | Lin et al. | 216/2 |
| 6,352,874 B1 * | 3/2002 | McNeil et al. | 438/53 |
| 6,446,326 B1 * | 9/2002 | Mastromatteo et al. | 29/603.04 |
| 6,552,404 B1 * | 4/2003 | Hynes et al. | 257/415 |
| 6,635,509 B1 * | 10/2003 | Ouellet | 438/106 |
| 6,779,247 B1 * | 8/2004 | Murari et al. | 29/603.01 |
| 6,936,491 B2 * | 8/2005 | Partridge et al. | 438/48 |
| 7,265,429 B2 * | 9/2007 | Wan | 257/415 |
| 7,429,495 B2 * | 9/2008 | Wan | 438/53 |
| 2004/0028849 A1 | 2/2004 | Stark et al. | |
| 2004/0065932 A1 * | 4/2004 | Reichenbach et al. | 257/415 |
| 2004/0126953 A1 * | 7/2004 | Cheung | 438/200 |

FOREIGN PATENT DOCUMENTS

| | | |
|---|---|---|
| WO | WO 01/46066 A | 6/2001 |
| WO | WO 03/089368 A | 10/2003 |

\* cited by examiner

MICROCOMPONENT COMPRISING A HERMETICALLY-SEALED CAVITY AND A PLUG, AND METHOD OF PRODUCING ONE SUCH MICROCOMPONENT

BACKGROUND OF THE INVENTION

The invention relates to a microcomponent comprising a hermetically-sealed cavity, delineated by a cover in which at least one hole is formed, and, on the cover, a sealing layer sealing the microcavity hermetically.

STATE OF THE ART

Hermetic encapsulation of electromechanical microsystems is necessary for several reasons. Dust and humidity can, in particular, disturb operation of the moving parts and the electric contacts can be impaired by the oxygen of the ambient air.

Conventionally, electromechanical Microsystems are enclosed in a hermetically-sealed microcavity delineated by a cover. A known method for production of a hermetic cover is represented in FIGS. 1 and 2. The electromechanical microsystems 1 are generally arranged on a substrate 2. As represented in FIG. 1, the cover is formed, on the substrate 2 and on a sacrificial layer 3 formed on the substrate 2, by a solid layer 4 in which a hole 5, or possibly several holes 5, is or are formed. Then the sacrificial layer 3 is removed via the hole 5 so as to obtain a microcavity 6, as represented in FIG. 2. Then a sealing layer 7 is deposited on the solid layer 4 forming the cover, so as to make the microcavity 6 hermetic.

Fabrication by means of a sacrificial layer 3 gives rise to two problems, among other, i.e. an insufficient tightness of sealing and a lengthy time required for the removal step of the sacrificial layer 3, in particular in the case of large covers 4.

To achieve hermetic sealing of the cover 4, the holes 5 are in fact typically small and localized in zones of the sacrificial layer 3, and consequently of the microcavity 6, that present a small thickness, as represented in FIG. 1. Typically, the thickness of the sacrificial layer 3 at the location of the hole 5, in a peripheral zone of the microcavity 6, is about 0.3 microns, whereas the thickness of the sacrificial layer 3 covering the electromechanical Microsystems 1 is about 10 microns. The etching step of the sacrificial layer 3 is then long and difficult. This drawback is all the more pronounced the smaller the thickness of the sacrificial layer 3 at the location of the hole 5, to achieve the best possible sealing, which thickness is sometimes less than 0.2 microns.

The document DE10005555 describes a microcomponent comprising a hermetic cavity delineated by a cover. The cover is formed by bottom and top layers respectively comprising holes offset with respect to one another. The holes of the top layer are sealed by closing layers, preferably made of aluminium, arranged on the bottom layer, under the holes. The bottom layer thus acts as continuous solid support for the sealing layers. When the sealing layers are made of aluminium, a temperature of 660° C. is applied to melt the sealing layers The sealing layers are located entirely above the top layer. The holes of the top layer are then filled by an additional sealing layer covering the top layer.

OBJECT OF THE INVENTION

It is one object of the invention to remedy these shortcomings and, in particular, to achieve hermetic sealing of a microcavity while reducing the time required to produce the microcavity.

According to the invention, this object is achieved by the appended claims and in particular by the fact that the microcomponent comprises, under the sealing layer, a plug covering the hole and a part of the cover over the periphery of the hole, the plug being made from a material that is able to undergo creep deformation.

It is a further object of the invention to provide a method for production of a hermetically-sealed microcavity of a microcomponent, successively comprising deposition of a sacrificial layer on a substrate, deposition of a first layer forming a cover, on the substrate and sacrificial layer, etching, in the cover, of at least one hole opening out onto the sacrificial layer, removal of the sacrificial layer, via the hole, so as to create the microcavity, deposition of the sealing layer, so as to seal the microcavity hermetically, method comprising deposition of the plug covering the hole and a part of the cover over the periphery of the hole, after the sacrificial layer has been removed and before the sealing layer is deposited.

BRIEF DESCRIPTION OF THE DRAWINGS

Other advantages and features will become more clearly apparent from the following description of particular embodiments of the invention given as non-restrictive examples only and represented in the accompanying drawings, in which.

Les

DESCRIPTION OF PARTICULAR EMBODIMENTS

Figure 1:
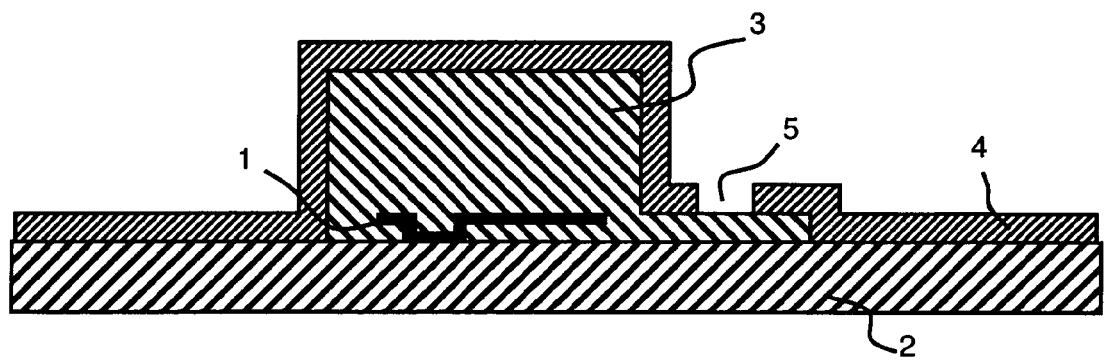
FIGS. 1 and 2 represent two steps of a method for production of a microcomponent according to the prior art.
Figure 2:
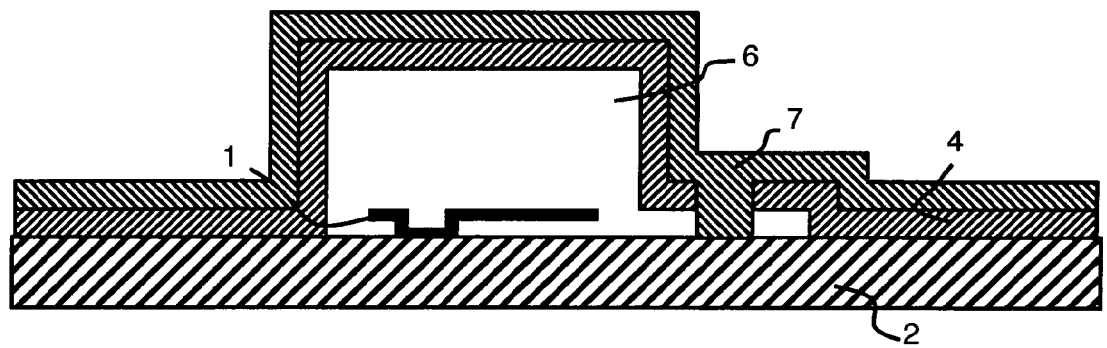
Figure 3:
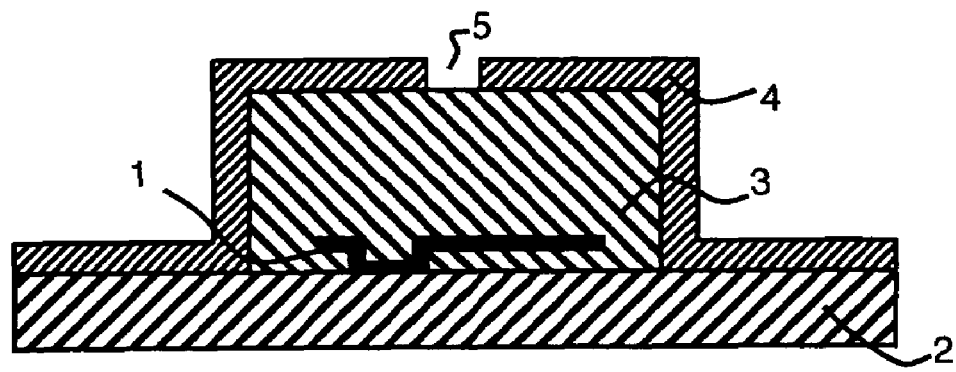
FIGS. 3 to 6 represent, in cross-section, four successive steps of a particular embodiment of a method for production of a microcomponent according to the invention.
Figure 4:
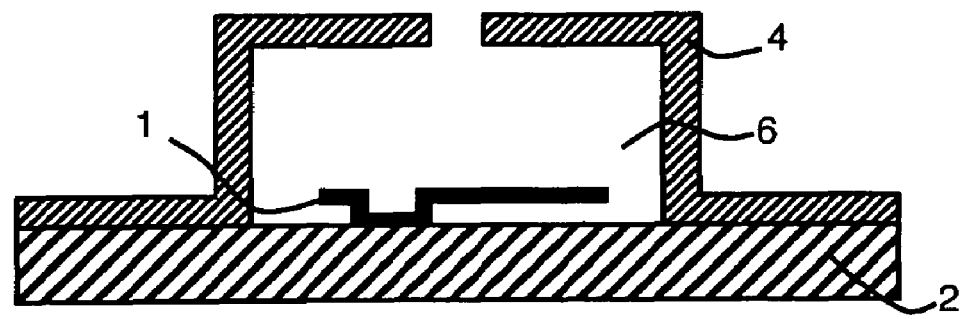

As represented in FIGS. 3 and 4, the hole 5 etched in the cover 4 and opening out on the sacrificial layer 3 is preferably arranged on the highest part of the microcavity 6, i.e. at a location where the sacrificial layer 3 has a maximum thickness, for example about 8 to 10 microns. In this way, the duration of the subsequent creation step of the microcavity 6 by removal of the sacrificial layer 3, through the hole 5, represented in FIG. 4, is substantially reduced compared with the prior art.

Figure 5:
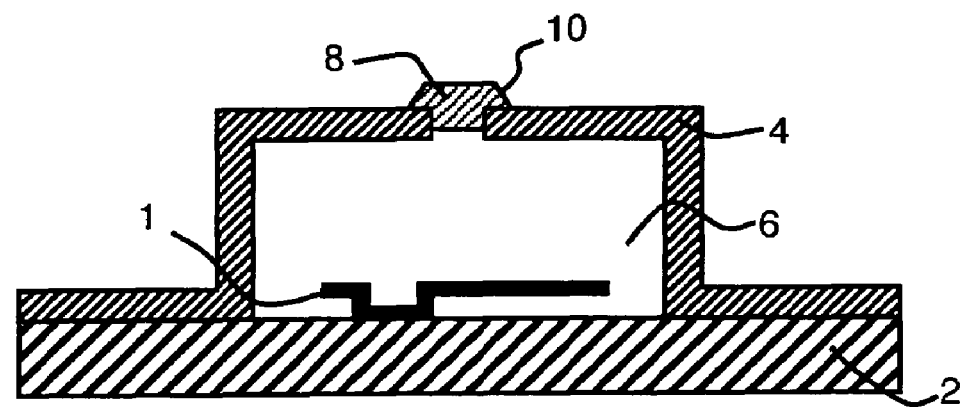
Figure 6:
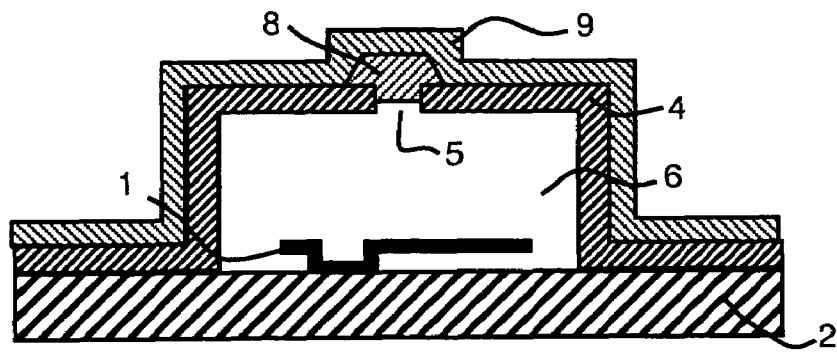

In FIG. 5, a plug 8 is deposited, after the sacrificial layer 3 has been removed and before deposition of the sealing layer 9, so as to cover the hole 5 and a part of the cover 4 over the periphery of the hole 5. The plug 8 is made from a material that is able to undergo creep deformation. In a first embodiment, the material that is able to undergo creep deformation is a polymerized material, selected in particular from photoresist and polyimide. In a second embodiment, the material that is able to undergo creep deformation is a glass, selected in particular from phosphosilicate glasses. These materials seal the hole 5 without entering the microcavity 6. Moreover, these materials support the deposition conditions of the sealing layer 9 designed to seal the microcavity 6 hermetically, as represented in FIG. 6. The plug 8 preferably has a thickness comprised between 2 and 6 micrometers.

The plug can be achieved by deposition of a viscous polymer solution covering the cover 4, followed by etching of the layer thus obtained to delineate the plug 8 laterally.

It is well known that, for polymers, the temperatures applied during the method must not exceed 450° C. The use of polymers is then particularly suitable for methods performed at low temperature, i.e. methods having a maximum temperature comprised for example between 300° C. and 450° C., or even less.

In another embodiment the plug 8 can be produced by a method of the sol-gel type or by cathode sputtering, so as to obtain, for example, a phosphosilicate glass (PSG).

As represented in FIGS. 5 and 6, the plug 8 can have sloping sides 10, which improves the adhesion of the sealing layer 9 deposited on the plug 8, thus ensuring hermetic sealing without any risk of cracking.

Figure 7:
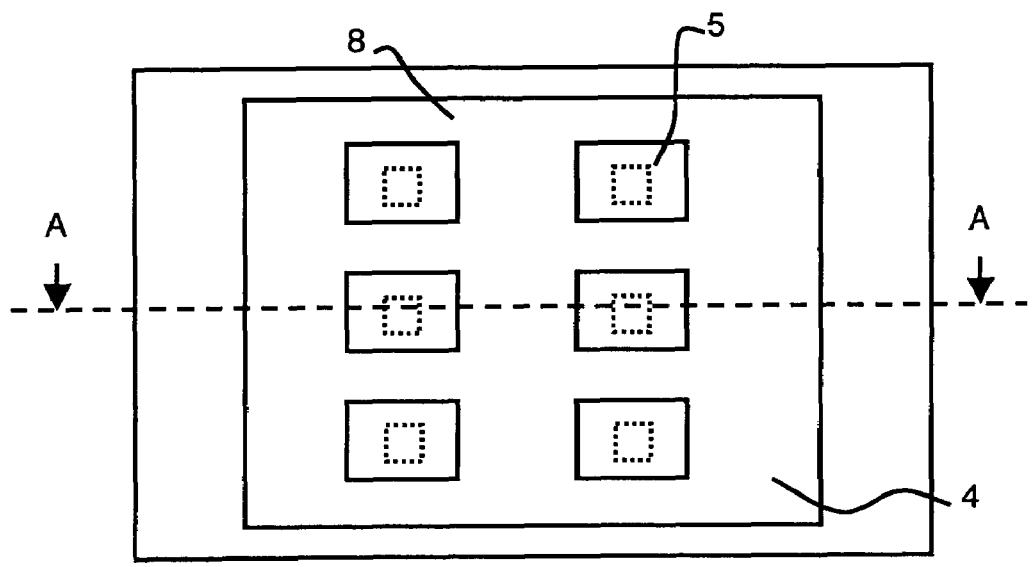
FIGS. 7 and 8 represent the step prior to deposition of the sealing layer of another particular embodiment of a method for production of a microcomponent according to the invention, respectively in top view and in cross-section along the line A-A.
Figure 8:
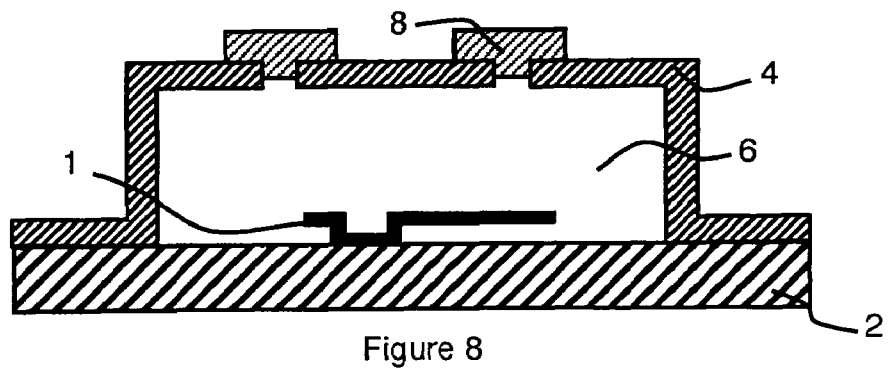

To prevent the material forming the plug 8 from depositing inside the microcavity 6, the dimension of the hole 5 is preferably smaller than 5 micrometers. The hole 5 can for example have a substantially rectangular cross-section of 3 μm by 5 μm. As etching of the sacrificial layer 3 is slowed down by reduction of the size of the hole 5, the microcomponent preferably comprises a plurality of holes 5, in particular in the case of a cover 4 of large size. In FIGS. 7 and 8, for example, six holes 5 are arranged on two lines each comprising three holes 5. Each of the holes 5 is sealed by an associated plug 8 covering the corresponding hole 5 and a part of the cover 4 over the periphery of the hole 5, for example over a surface of 20 μm by 15 μm.

Figure 9:
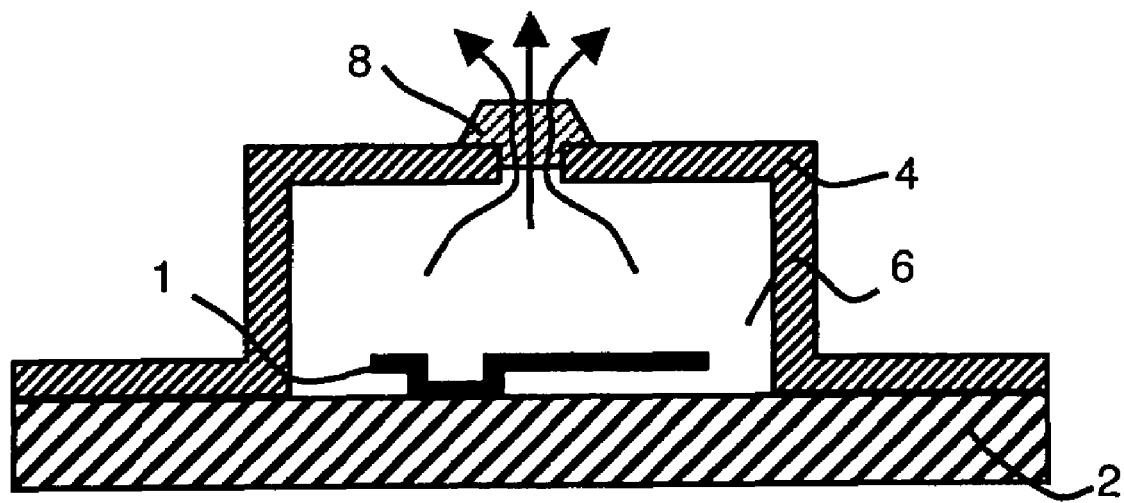
FIG. 9 represents a pumping step of a particular embodiment of a method for production of a microcomponent according to the invention.

The plug 8 is not necessarily hermetic. In particular, the plug can be formed by a porous material, for example by a porous polymer. The porous material is, for example, a photoresist annealed at a temperature of more than 300° C. As illustrated in FIG. 9, a porous plug 8 enables gas contained in the microcavity 6 to be pumped through the porous material before the sealing layer 9 is deposited. This enables the pressure and nature of the gas inside the microcavity 6 to be controlled during the sealing step.

The material of the sacrificial layer 3 can be a polymer, for example polyimide or a photoresist, enabling rapid etching, for example dry etching, or a material obtained by a sol-gel type process. The cover 4 and sealing layer 9 can be made of silicon dioxide ($SiO_2$), silicon nitride ($Si_3N_4$) or metal. The cover 4 can for example be achieved by deposition of silicon dioxide having, for example, a thickness of 1.5 microns. The sealing layer 9 is preferably achieved by deposition of silicon nitride having a thickness of 2 microns for example.

The invention is not limited to the particular embodiments represented. In particular, there can be any number of holes 5. A single layer forming several plugs 8 can if required be associated with several holes 5.

The invention claimed is:

1. Microcomponent comprising:
a hermetically-sealed microcavity having a top side, a left side, and a right side,
a cover in which at least one hole is formed, the cover being one solid layer that delineates the microcavity and encloses the top side, the left side, and the right side of the microcavity,
a plug forming a unitary piece made of polymer covering only one hole and a part of the cover over the periphery of the hole,
a sealing layer hermetically sealing the microcavity, the sealing layer being disposed above the plug and the cover, the sealing layer and the plug being formed by distinct materials.

2. Microcomponent according to claim 1, wherein the mierocavity encloses an electromechanical microsystem.

3. A Method for production of a hermetically-sealed microcavity of a microcomponent, successively comprising:
deposition of a sacrificial layer on a substrate;
deposition of a first layer forming the cover, on the substrate and sacrificial layer;
etching, in the cover, of at least one hole opening out onto the sacrificial layer;
removal of the sacrificial layer, via the hole, so as to create the microcavity;
deposition of the sealing layer, so as to seal the microcavity hermetically;
the method comprising deposition of a plug covering the hole and a part of the cover over the periphery of the hole, after the sacrificial layer has been removed and before the sealing layer is deposited;
wherein the plug is made of phosphosilicate glass, and the plug is obtained by a method selected from solgel methods and cathode sputtering.

4. A Method for production of a hermetically-sealed microcavity of a microcomponent, successively comprising:
deposition of a sacrificial layer on a substrate;
deposition of a first layer forming the cover, on the substrate and sacrificial layer;
etching, in the cover, of at least one hole opening out onto the sacrificial layer;
removal of the sacrificial layer, via the hole, so as to create the microcavity;
deposition of the sealing layer, so as to seal the microcavity hermetically;
the method comprising deposition of a plug covering the hole and a part of the cover over the periphery of the hole, after the sacrificial layer has been removed and before the sealing layer is deposited;
wherein the plug is made of a porous material; and
wherein, the porous material is a photoresist, and the method comprises a high temperature annealing step.

5. Microcomponent comprising:
a hermetically-sealed microcavity,
a cover in which at least one hole is formed, the cover being one solid layer that delineates the microcavity,
a plug forming a unitary piece made of phosphosilicate glass covering only one hole and a part of the cover over the periphery of the hole,
a sealing layer hermetically sealing the microcavity, the sealing layer being disposed above the plug and the cover, the sealing layer and the plug being formed by distinct materials.

6. Microcomponent comprising:
a sacrificial layer on a substrate,
cover in which at least one hole is formed, the cover provided over the sacrificial layer and over the substrate at the periphery of the sacrificial layer,
a hermetically-sealed microcavity formed by removal of all of the sacrificial layer via the at least one hole,
a plug forming a unitary piece made of polymer covering only one hole and a part of the cover over the periphery of the hole,
a sealing layer hermetically sealing the microcavity, the sealing layer being disposed above the plug and the cover, the sealing layer and the plug being formed by distinct materials.

7. Microcomponent according to claim 6, wherein the polymer is selected from photoresists and polyimide.

8. Microcomponent according to claim 6, wherein the dimension of the hole is smaller than 5 micrometers.

9. Microcomponent according to claim 6, wherein the hole is arranged on the highest part of the microcavity.

10. Microcomponent according to claim 6, comprising a plurality of holes.

11. Microcomponent according to claim 6, wherein the thickness of the plug is comprised between 2 and 6 micrometers.

12. Microcomponent according to claim 6, wherein the plug comprises sloping sides.

13. Microcomponent according to claim 6, wherein the plug is non-hermetical.

14. Microcomponent according to claim 6, wherein the material of the sealing layer is selected from silicon dioxide, silicon nitride and metals.

15. Method for production of a hermetically-sealed microcavity of a microcomponent according to claim 6, successively comprising deposition of a sacrificial layer on a substrate, deposition of a first layer forming the cover, on the substrate and sacrificial layer, etching, in the cover, of at least one hole opening out onto the sacrificial layer, removal of the sacrificial layer, via the hole, so as to create the microcavity, deposition of the sealing layer, so as to seal the microcavity hermetically, method comprising deposition of the plug covering the hole and a part of the cover over the periphery of the hole, after the sacrificial layer has been removed and before the sealing layer is deposited.

16. Method according to claim 15, wherein the plug is made of a porous material.

17. Method according to claim 16, wherein the method comprises a pumping step of the gas contained in the microcavity, through the porous material, before the sealing layer is deposited.

18. Method according to claim 6, wherein the geometry of the microcavity is defined by the area of the removed sacrificial layer.

* * * * *